United States Patent
Gandolfi et al.

(10) Patent No.: US 10,364,043 B2
(45) Date of Patent: Jul. 30, 2019

(54) PASSIVE AIRCRAFT COOLING SYSTEMS AND METHODS

(71) Applicants: EMBRAER S.A., São José dos Campos-SP (BR); UNIVERSIDADE FEDERAL DE SANTA CATARINA (UFSC), Florianópolis-Santa Catarina (BR)

(72) Inventors: Ricardo Gandolfi, São José dos Campos (BR); Luiz Gonzaga De Souza Ribeiro, São José dos Campos (BR); Marcia Barbosa Henriques Mantelli, Florianópolis-Santa Catarina (BR); Jorge Luiz Goes Oliveira, Florianópolis-Santa Catarina (BR); Kleber Vieira De Paiva, Florianópolis-Santa Catarina (BR)

(73) Assignees: EMBRAER S.A., São José dos Campos-SP (BR); UNIVERSIDADE FEDERAL DE SANTA CATARINA (UFSC), Trindade, Florianópolis-Santa Catarina (BR)

( * ) Notice: Subject to any disclaimer, the term of this patent is extended or adjusted under 35 U.S.C. 154(b) by 505 days.

(21) Appl. No.: 14/322,133

(22) Filed: Jul. 2, 2014

(65) Prior Publication Data

US 2016/0198591 A1 Jul. 7, 2016

(51) Int. Cl.
*F28D 15/02* (2006.01)
*H05K 7/20* (2006.01)
(Continued)

(52) U.S. Cl.
CPC ........... *B64D 47/00* (2013.01); *H05K 7/2029* (2013.01); *B64D 2013/064* (2013.01);
(Continued)

(58) Field of Classification Search
CPC ........ H05K 7/20245; B64D 2013/0625; B64D 2013/064; B64D 2013/0688; B64D 47/00; B64D 2013/0614; F28D 15/0266
(Continued)

(56) References Cited

U.S. PATENT DOCUMENTS 4,128,123 A * 12/1978 Garriss ............... F25B 23/006
165/104.22
5,127,471 A * 7/1992 Weislogel ........... F28D 15/0266
165/104.14
(Continued)

FOREIGN PATENT DOCUMENTS

FR 2894563 A1 * 6/2007 ........... B64D 13/006

OTHER PUBLICATIONS

Translation of French Patent Document FR 2894563 A1 entitled Translation—FR 2894563 A1.*

*Primary Examiner* — Paul Alvare
(74) *Attorney, Agent, or Firm* — Nixon & Vanderhye P.C.

(57) ABSTRACT

Passive on-board aircraft cooling systems are provided with an evaporator/receiver in heat-exchange relationship with at least one heat source on board the aircraft, the evaporator/receiver containing a liquid phase working fluid which changes state to a vapor phase working fluid in response to heat transfer therefrom from the at least one heat source. First and second condensers are fluid-connected to the evaporator/receiver for receiving vapor phase working fluid from the evaporator/receiver. At least a portion of the vapor phase working fluid transferred to the first and second condensers is condensed by heat transfer between the first and second condensers and aircraft-external unpressurized and aircraft-internal pressurized air supply streams, respectively, to thereby form liquid phase working fluid which
(Continued)

returns to the evaporator/receiver by virtue of the fluid connection with the first and second condensers.

20 Claims, 3 Drawing Sheets

(51) Int. Cl.
  *B64D 13/06* (2006.01)
  *B64D 47/00* (2006.01)
(52) U.S. Cl.
  CPC ........ *B64D 2013/0614* (2013.01); *B64D 2013/0625* (2013.01); *B64D 2013/0688* (2013.01); *F28D 15/0266* (2013.01); *H05K 7/20245* (2013.01)
(58) Field of Classification Search
  USPC ......... 165/104.21, 104.31; 62/61, 244, 259.2
  See application file for complete search history.

(56) References Cited

U.S. PATENT DOCUMENTS

| | | | |
|---|---|---|---|
| 5,369,960 A * | 12/1994 | Mueller | B64D 13/00 165/168 |
| 5,667,168 A * | 9/1997 | Fluegel | B64C 1/38 165/169 |
| 7,505,267 B2 | 3/2009 | Sarno et al. | |
| 7,967,249 B2 | 6/2011 | Muhlthaler et al. | |
| 2007/0095521 A1* | 5/2007 | Muhlthaler | B64D 11/04 165/274 |
| 2010/0146998 A1 | 6/2010 | Tomioka et al. | |
| 2011/0186263 A1* | 8/2011 | Piesker | B64D 13/00 165/47 |
| 2012/0000630 A1* | 1/2012 | Reiss | B64D 13/00 165/104.21 |
| 2013/0312937 A1* | 11/2013 | Tsukinari | H01L 23/427 165/104.21 |

\* cited by examiner

PASSIVE AIRCRAFT COOLING SYSTEMS AND METHODS

FIELD

The embodiments disclosed herein relate generally to passive cooling systems which are especially adapted for use on-board an aircraft.

BACKGROUND

The aeronautical industry has gradually increased its demand for greater cooling power for on-board electro-electronic equipment. This increased cooling power demand is evident with the advent of transport category aircraft that depend more heavily on electrically powered on-board systems that have been implemented to replace the more conventional pneumatic and/or hydraulic power-based systems, such as electric flight control actuators, cabin compressors for environmental control systems and electric heaters for ice protection. As a consequence, the electrical power requirements to assist such electric-powered systems and electronics (motor controllers, power converters and the like) have in turn risen proportionally thereby requiring a greater ability to dissipate more heat. Additionally, as both size and weight are significant penalties for aircraft components, the power density per unit of surface area tends to increase as well. Therefore, in order make it feasible to install on-board electronics with high heat dissipation, it is necessary to implement more efficient techniques to remove heat from such devices.

Aircraft cooling systems currently in use traditionally use air as the working fluid. Natural convection has inherently high thermal resistance between heat sources and sinks. Air forced convection by fans reduces the inefficiency of cooling systems by increasing heat transfer coefficients but the fans generate acoustic noise, consume electrical power, add weight and require periodic maintenance.

Heat transfer devices such as passive thermosyphons and heat pipes can be classified as heat superconductors. Under project constraints, these devices present low thermal resistance and acoustic noise. In addition, power consumption is not required and maintenance is expected to decrease drastically as compared to air-forced convection cooling systems. Therefore, passive thermosyphon heat transfer devices are suitable to be used in aircraft applications.

In the aircraft industry, the application of heat pipes and thermosyphons is limited to compartments where the installation of traditional cooling elements such as ducts and fans is difficult to be accomplished. Cooling techniques based upon heat pipe technology have recently been observed. For example, U.S. Pat. No. 7,505,267 (the entire content of which is expressly incorporated hereinto by reference) discloses the use of heat pipes in a refrigeration circuit for cabin entertainment devices located in areas of difficult heat removal (e.g. within and beneath passengers' seats).

U.S. Pat. No. 7,967,249 (the entire content of which is expressly incorporated hereinto by reference) proposes a refrigeration system with heat pipes, loop heat pipes, a cold storage unit and a fuselage heat exchanger. The system that is proposed by such patent, however, has as several disadvantages including the use of air as the heat transfer media between the equipment and the cooling system, the use of a fan in the electronic equipment compartment and a cold storage unit (which necessarily adds undesirable weight to the system).

What has been needed therefore are lightweight high capacity cooling systems that are especially adapted for on-board use in aircraft. It is towards fulfilling such a need that the embodiments herein are directed.

SUMMARY

In general, the embodiments disclosed herein are directed toward passive (i.e., cooling systems which do not force a working fluid vapor and/or liquid through the system by means of fans and/or pumps) on-board aircraft cooling systems that include heat pipes and thermosyphon technology which are applied at heat sources located inside and outside the aircraft. In this regard, the term "heat source" refers to any devices which may generate heat and requires cooling, such as electrical and electronic equipment, power sources, radar systems, condensers, coolers, galleys and the like.

The cooling system according to certain embodiments described herein is intermediately positioned between one or more heat sources and two heat sinks, namely aircraft cabin-external air and aircraft cabin-internal air (e.g., the air inside the pressurized cabin environment such as internal cabin air, cockpit air, air directed to exhaust valves, fresh air from the environmental control system, and the like).

According to some embodiments, the cooling system receives heat from one or more heat sources in a receiver (i.e., the refrigeration system evaporator). The evaporator may include a mechanical interface to external mechanical fitting elements, resulting in a thermal interface termed a "cold-bus" to transfer heat from the heat source(s) to the evaporator of the refrigeration system.

The heat received by the evaporator causes evaporation of a working fluid such as water, acetone, ethanol, methanol, R22, R12, R134a and like refrigerants, and is transported to the condensers of the refrigeration system by a difference in specific weight. The working fluid condenses in the condensers which are responsible for transferring heat to the heat sinks. These condensers can be arranged in series or in parallel as will be described in greater detail below. In an embodiment whereby the condensers are arranged in parallel, there are distinct ducts that carry vapor from the evaporator to each condenser. The return of the condensed fluid from the condensers to the evaporator occurs through separate ducts thereby forming loops.

In an embodiment whereby the condensers are arranged in series, working fluid vapor is transported to the nearest condenser by ducts which link directly the evaporator of the nearest condenser. The vapor transport to a second condenser occurs by distinct ducts which link the nearest condenser to the second condenser. The return of the condensed fluid from the condensers to the evaporator can occur through the ducts that connect the evaporator to the nearest condenser or alternatively through dedicated ducts that only carry condensed fluid directly to the evaporator.

The performance of each condenser to transfer heat to the external air or the air inside a pressurized environment depends on local duct losses. The control of the pressure drop can be performed by use of valves (e.g. solenoid valves, orifice plates and the like) positioned in the return lines of the condensed fluid or in the vapor transport lines.

Passive on-board aircraft cooling systems according to embodiments disclosed herein will therefore preferably comprise an evaporator/receiver in heat-exchange relationship with at least one heat source on board the aircraft, the evaporator/receiver containing a liquid phase working fluid which changes state to a vapor phase working fluid in response to heat transfer therefrom from the at least one heat source. First and second condensers are fluid-connected to the evaporator/receiver for receiving vapor phase working fluid from the evaporator/receiver. An aircraft-internal pressurized air supply stream is provided in heat-exchange relationship with the second condenser, and an aircraft-external unpressurized air supply stream is provided in heat-exchange relationship with the first condenser. At least a portion of the vapor phase working fluid transferred to the first and second condensers is thus condensed by heat transfer between the first and second condensers and the unpressurized and pressurized air supply streams, respectively, to thereby form liquid phase working fluid which returns to the evaporator/receiver by virtue of the fluid connection with the first and second condensers.

The first and second condensers may be fluid-connected to one another in parallel or in series.

If the first and second condensers are connected in parallel, then the system may be provided with first and second vapor supply conduits and first and second liquid return conduits. The first vapor supply conduit and the first liquid return conduit are fluid-connected between the evaporator/receiver and the first condenser to thereby establish a first two phase closed loop working fluid flow path therebetween. The second vapor supply conduit and the second liquid return conduit are fluid connected between the evaporator/receiver and the second condenser to establish a second two phase closed loop working fluid flow path therebetween. At least one or each of the first and second two phase closed loop working fluid flow paths may include a valve mechanism.

If the first and second condensers are fluid-connected to one another in series, then the system may be provided with a first collector positioned between the first and second condensers for collecting a portion of the liquid phase working fluid condensed by the second condenser and having a vapor space thereabove containing a portion of the vapor phase working fluid. At least one first vapor supply/liquid return conduit may be provided having one end fluid connected to the evaporator/receiver and an opposite end terminating in the vapor space of the first collector. At least one second vapor supply/liquid return conduit may be fluid-connected to the first collector and in heat-exchange relationship with the second condenser. A liquid return conduit fluid connecting the first collector and the evaporator/receiver returns liquid phase working fluid from the first collector to the evaporator/receiver. A valve mechanism may be positioned in the liquid return conduit.

Another embodiment of series-connected first and second condensers will include a first collector positioned between the first and second condensers, the first collector for collecting a portion of the liquid phase working fluid condensed by the second condenser and having a vapor space thereabove containing a portion of the vapor phase working fluid, and a second collector positioned between the evaporator/receiver and the first condenser, the second collector for collecting another portion of the liquid phase working fluid condensed by the first condenser and having a vapor space thereabove containing another portion of the vapor phase working fluid. At least one first vapor supply/liquid return conduit is provided having one end fluid connected to the evaporator/receiver and an opposite end terminating in the vapor space of the second collector. At least one second vapor supply/liquid return conduit in heat-exchange relationship with the first condenser will have one end fluid-connected to the second collector and an opposite end terminating in the vapor space of the first collector. At least one third vapor supply/liquid return conduit is fluid-connected to the first collector and in heat-exchange relationship with the second condenser. A first liquid return conduit fluid connecting the first collector and the evaporator/receiver returns liquid phase working fluid from the first collector to the evaporator/receiver, and a second liquid return conduit fluid connecting the second collector and the evaporator/receiver returns liquid phase working fluid from the second collector to the evaporator/receiver. At least one or each of the first and second liquid return conduits may include a valve mechanism.

The invention also relates to methods for on-board cooling of at least one aircraft heat source. According to certain embodiments thereof, the method may comprise:

(a) providing an evaporator/receiver in heat-exchange relationship with at least one heat source on board the aircraft, the evaporator/receiver containing a liquid phase working fluid which changes state to a vapor phase working fluid in response to heat transfer therefrom from the at least one heat source;

(b) fluid-connecting first and second condensers to the evaporator/receiver to receive vapor phase working fluid from the evaporator/receiver;

(c) bringing an aircraft-internal pressurized air supply stream into heat-exchange relationship with the second condenser;

(d) bringing an aircraft-external unpressurized air supply stream into heat-exchange relationship with the first condenser;

(e) condensing respective portions of the vapor phase working fluid by heat transfer between the first and second condensers and the unpressurized and pressurized air supply streams, respectively, to thereby form liquid phase working fluid; and (f) returning liquid phase working fluid condensed by the first and second condensers to the evaporator/receiver by virtue of the fluid connection with the first and second condensers.

Step (b) may comprise fluid connecting the first and second condensers in parallel or in series.

If connected in parallel, step (b) of certain embodiments may include:

(b1) fluid connecting the evaporator/receiver and the first condenser with a first vapor supply conduit and a first liquid return conduit to establish a first two phase closed loop working fluid flow path therebetween; and (b2) fluid connecting the evaporator/receiver and the second condenser with a second vapor supply conduit and a second liquid return conduit to establish a second two phase closed loop working fluid flow path therebetween.

Fluid flow in at least one or each of the first and second closed loop working fluid flow paths may be controlled by a valve mechanism.

If connected in series, then step (b) according to some embodiments may include:

(b1) positioning a first collector between the first and second condensers for collecting a portion of the liquid phase working fluid condensed by the second condenser;

(b2) fluid-connecting one end of at least one first vapor supply/liquid return conduit to the evaporator/receiver and terminating an opposite end thereof in a vapor space of the first collector;

(b3) fluid-connecting at least one second vapor supply/liquid return conduit to the first collector in heat-exchange relationship with the second condenser; and (b4) fluid-connecting a liquid return conduit between the first collector and the evaporator/receiver for returning liquid phase working fluid from the first collector to the evaporator/receiver.

A valve mechanism may be positioned in the liquid return conduit.

If connected in series, then step (b) according to other embodiments may include:

(b1) positioning a first collector between the first and second condensers for collecting a portion of the liquid phase working fluid condensed by the second condenser;

(b2) positioning a second collector between the evaporator/receiver and the first condenser for collecting a portion of the liquid phase working fluid condensed by the first condenser;

(b3) fluid-connecting one end of at least one first vapor supply/liquid return conduit to the evaporator/receiver and terminating an opposite end thereof in a vapor space of the second collector;

(b4) positioning at least one second vapor supply/liquid return conduit in heat-exchange relationship with the first condenser and fluid-connecting one end thereof to the second collector and terminating an opposite end thereof in a vapor space of the first collector;

(b5) fluid-connecting at least one third vapor supply/liquid return conduit to the first collector and in heat-exchange relationship with the second condenser (b6) positioning at least one second vapor supply/liquid return conduit in heat-exchange relationship with the second condenser and terminating an end thereof in a vapor space of the first collector; and (b7) fluid-connecting a first liquid return conduit between the first collector and the evaporator/receiver for returning liquid phase working fluid from the first collector to the evaporator/receiver; and (b8) fluid-connecting a second liquid return conduit between the second collector and the evaporator/receiver for returning liquid phase working fluid from the second collector to the evaporator/receiver.

These and other aspects and advantages of the present invention will become more clear after careful consideration is given to the following detailed description of the preferred exemplary embodiments thereof.

BRIEF DESCRIPTION OF ACCOMPANYING DRAWINGS

The disclosed embodiments of the present invention will be better and more completely understood by referring to the following detailed description of exemplary non-limiting illustrative embodiments in conjunction with the drawings of which:

DETAILED DESCRIPTION

Figure 1:
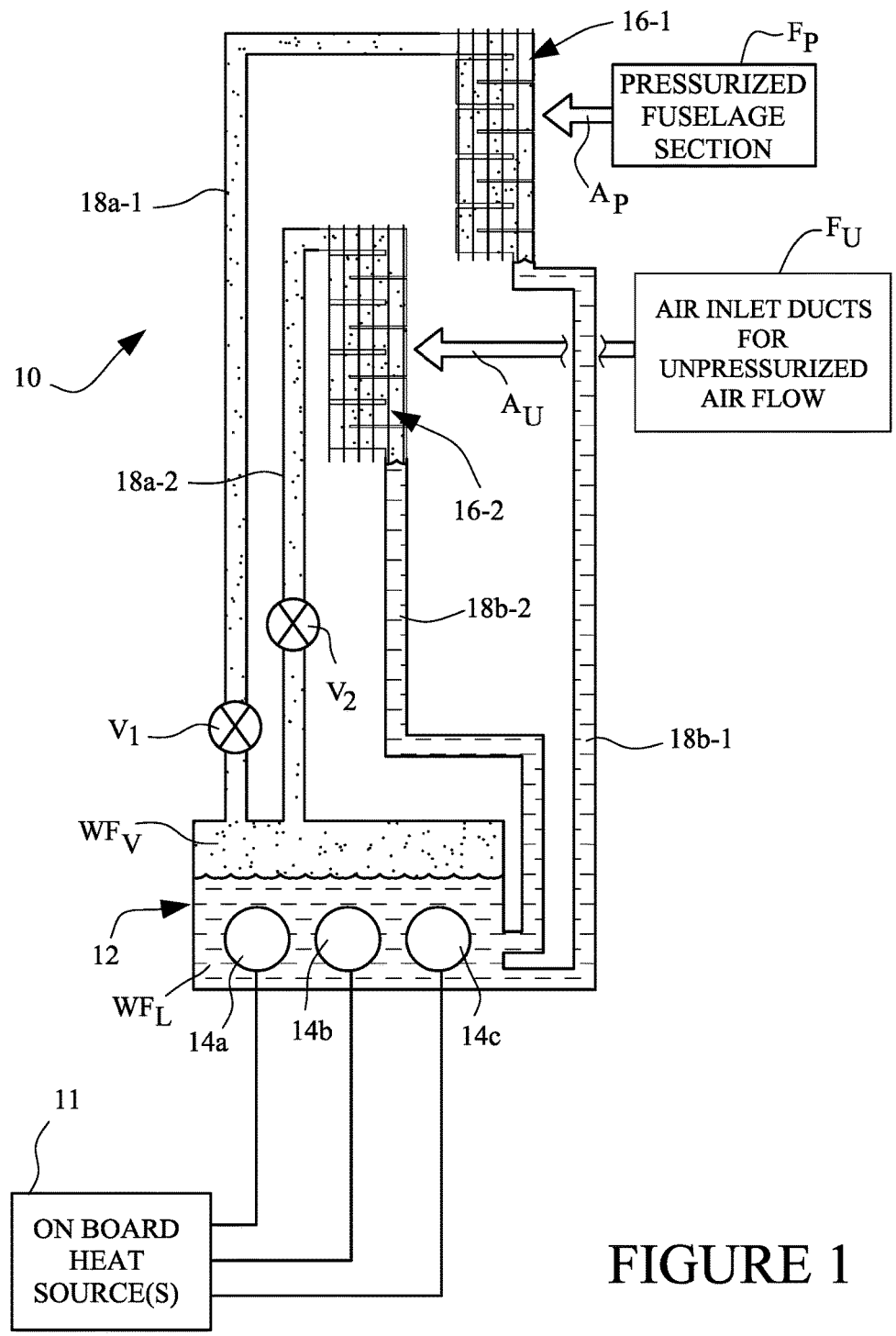
FIG. 1 is schematic diagram of one embodiment of the present invention for an on-board aircraft cooling system which includes condensers arranged in parallel.

Accompanying FIG. 1 schematically depicts one embodiment of a passive on-board aircraft cooling system 10 according the invention. As shown, the system 10 includes a combined evaporator and receiver which contains a working fluid in a liquid state (identified as $WF_L$). The liquid working fluid $WF_L$ is in heat-exchange relationship with on-board heat sources 11 via ducts identified as 14a, 14b and 14c submerged below the liquid level of working fluid WFL contained in the combined evaporator and receiver 12. The ducts 14a, 14b, and 14c may thus in turn be disposed in heat-exchange relationship with on-board equipment and/or systems which require cooling which are depicted schematically as the on-board heat sources 11. The heat from the on-board heat sources 11 which is transferred to and absorbed by the liquid working fluid $WF_L$ by the ducts 14a-14c will thereby cause the liquid working fluid $WF_L$ to change state by vaporization and form a vapor working fluid $WF_V$.

The combined evaporator and receiver 12 is in fluid connection in parallel to respective condensers 16-1, 16-2 by means of vapor supply conduits 18a-1, 18a-2, respectively. The condensers 16-1, 16-2 respectively receive the vapor working fluid $WF_V$ carried by the conduits 18a-1, 18a-2 and expose such vapor working fluid $WF_V$ to pressurized cabin-internal air (identified by arrow $A_P$ in FIG. 1). The pressurized cabin-internal air $A_P$ is provided when the aircraft fuselage is pressurized to thereby establish pressurized fuselage section $F_P$. The pressurized cabin-internal air $A_P$ can be provided by virtually any source of air inside the pressurized cabin environment of the pressurized fuselage section $F_P$ of the aircraft (e.g., internal cabin air, cockpit air, air directed to exhaust valves, fresh air from the environmental control system, and the like). Unpressurized cabin-external air Au can thus be provided by means of conventional air inlet ducts Fu associated with aircraft fuselage and associated connection ducts (not shown) directing the unpressurized cabin-external air $A_U$ from outside the pressurized fuselage section $F_P$ to the condenser 16-2. In another embodiment, the condenser 16-2 can be constructively integrated with the aircraft fuselage structure, in which case no external air inlet ducts $F^U$ are necessary since the fuselage is exposed to the external unpressurized air $A_U$.

The vapor working fluid WFV is transported to the condenser coils (not shown) associated with the condensers 16-1, 16-2 in heat-exchange relationship with the pressurized cabin-internal air AP and unpressurized cabin-external air AU. Heat is therefore transferred from the vapor working fluid WFV to the pressurized cabin-internal air AP and unpressurized cabin-external air AU acting as heat sinks. This heat transfer to the pressurized cabin-internal air AP and unpressurized cabin-external air AU causes a change of state to liquid working fluid WFL within the condenser coils of the condensers 16-1, 16-2. The liquid working fluid WFL formed by the change of state within the condensers 16-1, 16-2 is carried back to the combined evaporator and receiver 12 by liquid return conduits 18b-1, 18b-2, respectively.

As those in the art will appreciate, the unidirectional two-phase closed loop fluid flow from the combined evaporator and receiver 12 to the condensers 16-1, 16-2 and then from the condensers 16-1, 16-2 back to the combined evaporator and receiver 12 is driven by pressure differences between the higher pressure vapor phase working fluid $WF_V$ and the lower pressure liquid phase working fluid $WF_L$. The rate of fluid flow through the two-phase closed loops may be controlled by any suitable valve mechanisms positioned in the loop, e.g., active valves such as solenoid valves connected to a suitable flow rate sensor and/or static valves such as an orifice plate through which the fluid flows. By way of example, the embodiment of the system 10 depicted in FIG.

1 is provided with valve mechanisms V1, V2 positioned in the vapor supply conduits 18a-1, 18a-2, respectively. Such valve mechanisms V1, V2 could equivalently be positioned in operative arrangement with the liquid return conduits 18b-1, 18b-2, respectively.

Figure 2:
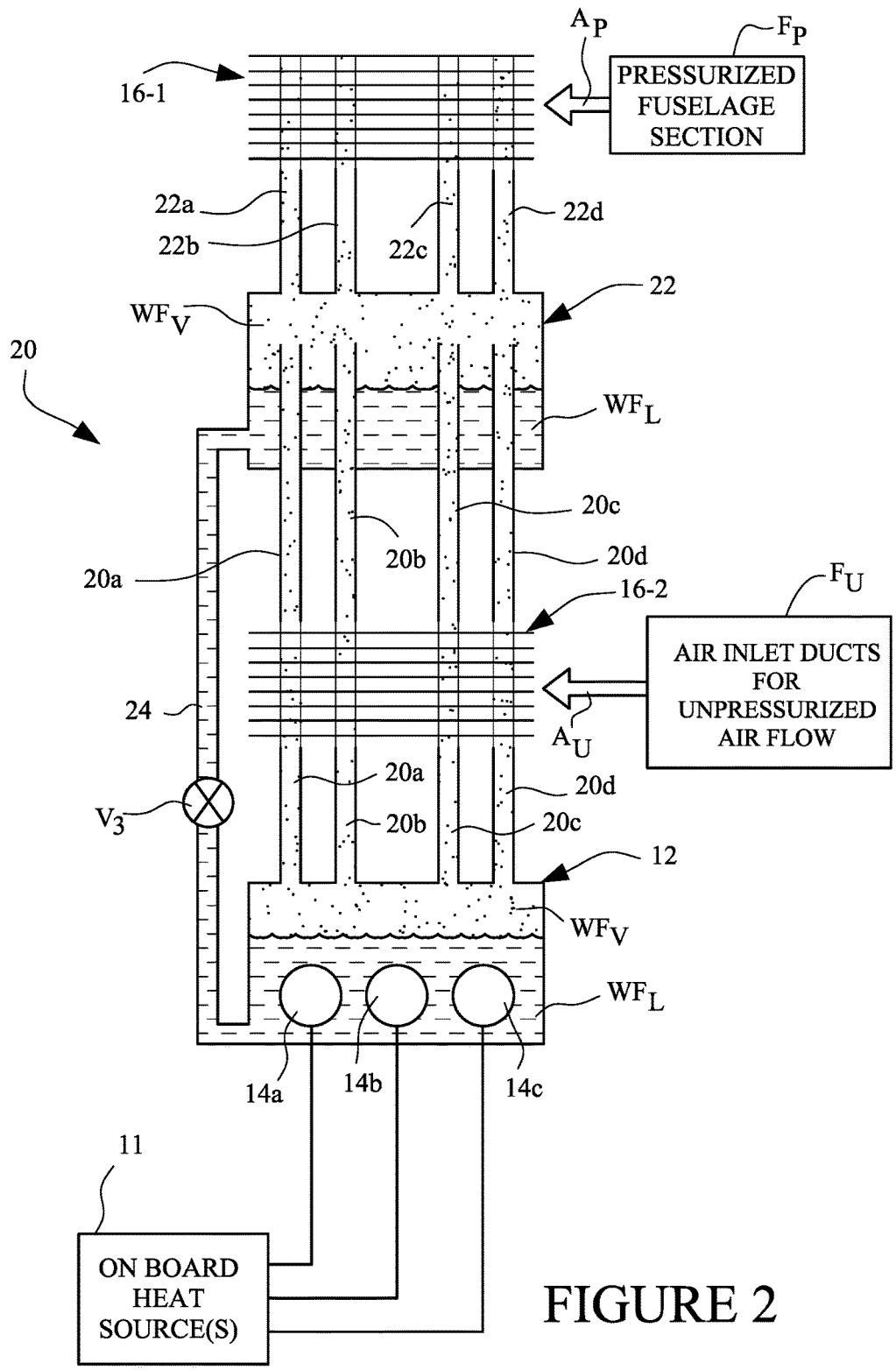
FIG. 2 is schematic diagram of another embodiment of the present invention for an on-board aircraft cooling system which includes condensers arranged in series.

As can be understood, the condensers 16-1, 16-2 depicted in FIG. 1 are arranged in parallel, i.e., since each condenser is associated with a respective two-phase closed-loop flow arrangement. In the embodiment depicted in FIG. 2, however, the condensers 16-1, 16-2 may be arranged in series. As is seen in FIG. 2, the system 20, like system 10 described above includes a combination evaporator and receiver in heat exchange relationship with on-board heat sources 11 via ducts 14a-14c submerged below the liquid level of the working fluid WFL contained in the combined evaporator and receiver 12. A plurality of vapor supply/liquid return conduits 20a-20d are fluid connected to the combined evaporator and receiver 12 and are positioned in heat exchange relationship with the condenser 16-2. The conduits 20a-20d terminate within the vapor space of a collector 22 (i.e., the space within collector 22 occupied by vapor phase working fluid WFV). A plurality of vapor supply/liquid return conduits 22a-22d are in fluid connection with the collector 22 and extend to heat-exchange relationship with the condenser 16-1.

Heat transferred to the liquid phase working fluid $WF_L$ from the on board heat sources 11 via the ducts 14a-14c submerged below the liquid level of the working fluid WFL contained in the combined evaporator and receiver 12 will thus cause such heat to be dissipated from such heat sources 11 via the ducts 14a-14c and thereby in turn cause a change of state to the vapor phase working fluid $WF_V$. The vapor phase working fluid $WF_V$ is thus directed by conduits 20a-20d to the condenser 16-2 which will cause a part of the vapor phase working fluid $WF_V$ to undergo a change of state to a liquid, i.e., by virtue of the heat-exchange relationship between the condenser 16-2 and the cabin-external unpressurized air $A_U$. This portion of the state-changed working fluid thus returns to the combined evaporator and receiver 12 as liquid phase working fluid $WF_L$ in countercurrent flow with the vapor phase working fluid $WF_V$.

The portion of the vapor phase working fluid $WF_V$ that is not condensed by condenser 16-2 is directed on to the collector 22 and the condenser 16-1 via the conduits 22a-22d. The condenser 16-1 thereby condenses the vapor phase working fluid $WF_V$ by virtue of the heat-exchange relationship between the condenser 16-1 and the cabin-internal pressurized air AP. The state-changed working fluid that is condensed by the condenser 16-1 thus returns as liquid phase working fluid $WF_L$ to the collector 22. The liquid phase working fluid $WF_L$ which collects in the collector 22 returns to the combined evaporator and receiver 12 by liquid return conduit 24. A valve mechanism V3 may be positioned in the return conduit 24 to control fluid flow within the two phase closed loop flow patch of the system 20.

Figure 3:
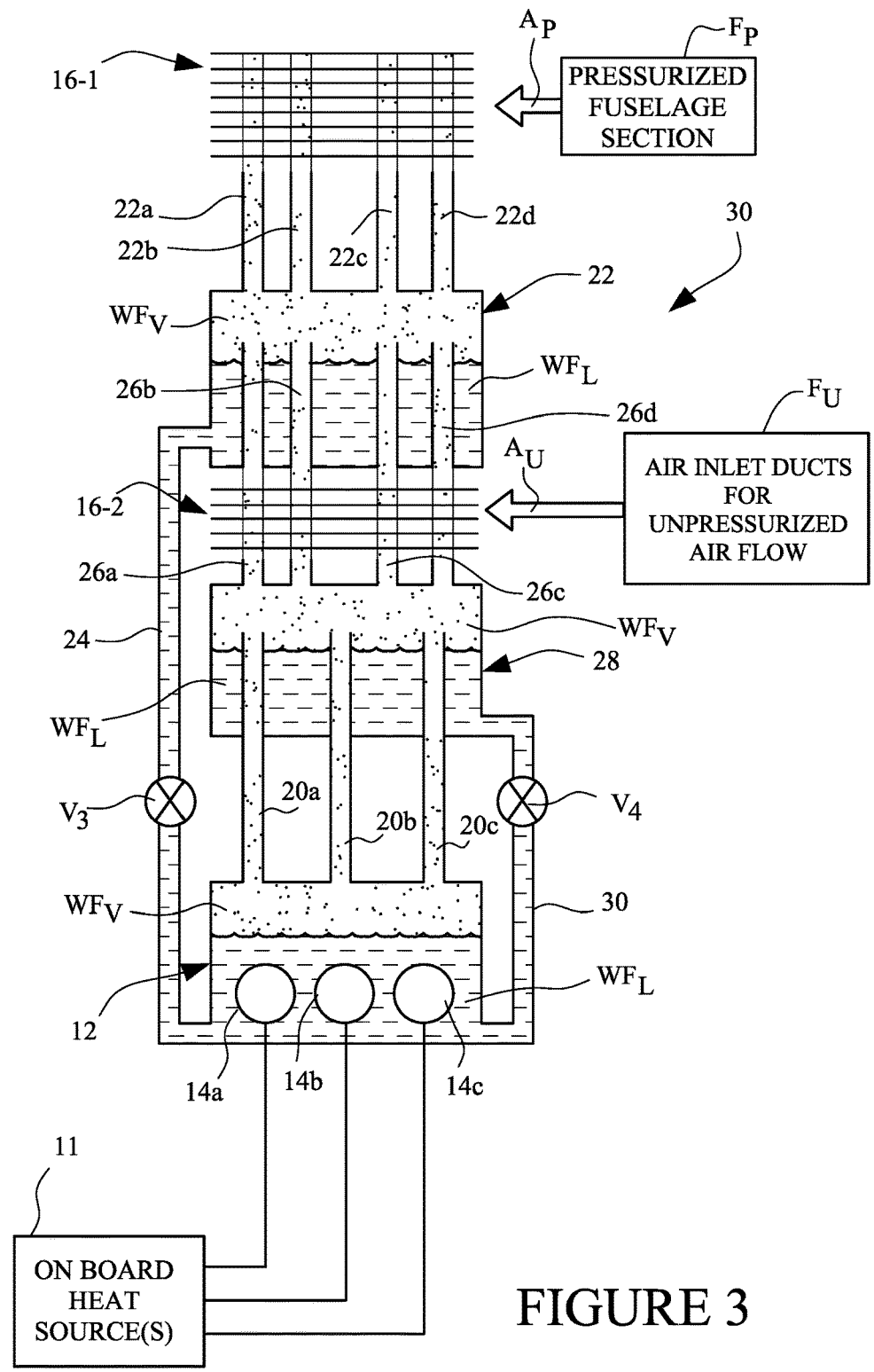
FIG. 3 is a schematic diagram of yet another embodiment of the present invention for an on-board aircraft cooling system similar to the embodiment shown in FIG. 2 but including a collector associated with each condenser.

The embodiment of the system 30 shown schematically by FIG. 3 is similar to the embodiment shown schematically by FIG. 2 except that the conduits 20a-20c terminate in the vapor space of a collector 28 (i.e., in the space within the collector 28 occupied by the vapor phase working fluid $WF_V$. A plurality of conduits 26a-26d are in fluid connection with the collector 28 and extend in heat-exchange relationship with the condenser 16-2 terminating in the vapor space of the collector 22 (i.e., the space within the collector 22 occupied by vapor phase working fluid $WF_V$). Thus, that portion of the working fluid which is condensed by the condenser 16-2 is returned as liquid phase working fluid $WF_L$ via conduits 26a-26d and collected in the collector 28. Liquid phase working fluid WFL collected in the collector 28 is returned to the combined evaporator and receiver 12 by a liquid return conduit 30 in which a valve mechanism V4 may be positioned to assist in fluid flow control.

It will be understood that the description provided herein is presently considered to be the most practical and preferred embodiments of the invention. Thus, the invention is not to be limited to the disclosed embodiments, but on the contrary, is intended to cover various modifications and equivalent arrangements included within the spirit and scope thereof.

What is claimed is:

1. An aircraft comprising:
   (i) an aircraft fuselage defining a pressurized fuselage section and an unpressurized air supply stream, wherein the pressurized fuselage section is pressurized to establish a fuselage internal pressurized aircraft cabin providing a source of pressurized air internal to the aircraft fuselage, and wherein the a unpressurized air supply stream is provided by a source of unpressurized air external to the aircraft fuselage and the aircraft cabin established therein when the pressurized fuselage section is pressurized, and
   (ii) a passive on-board cooling system comprising: multiple on-board heat sources within the aircraft cabin;
   a combined evaporator and receiver which contains a liquid phase working fluid which changes state to a vapor phase working fluid in response to heat transferred to the liquid phase working fluid from the multiple heat sources;
   multiple heat-transfer conduits each being in heat-exchange relationship with respective ones of the multiple on-board heat sources, wherein each of the heat-transfer conduits includes a portion which extends through the combined evaporator and receiver so that an external surface thereof is positioned below a liquid level of the liquid phase working fluid contained by the combined evaporator and receiver to thereby be surrounded by and immersed in the liquid phase working fluid in the combined evaporator and receiver;
   first and second condensers which are in fluid connection with the combined evaporator and receiver to receive the vapor phase working fluid from the combined evaporator and receiver, wherein
   the first condenser is operatively integrated with the aircraft fuselage so as to be in a ductless heat-exchange relationship with the unpressurized air supply stream from the source of unpressurized air external to the aircraft fuselage, and wherein
   the second condenser is operatively associated with the pressurized fuselage section so as to be in heat-exchange relationship with a pressurized air supply stream from the source of pressurized air internal to the aircraft cabin, wherein
   at least a portion of the vapor phase working fluid transferred to the first and second condensers is condensed by heat transfer between the first and second condensers and the unpressurized and pressurized air supply streams, respectively, to thereby form the liquid phase working fluid which returns to the combined evaporator and receiver by virtue of the fluid connection with the first and second condensers.

2. The aircraft according to claim 1, wherein the first and second condensers are in fluid connection with one another in parallel.

3. The aircraft according to claim 2, further comprising:
first and second vapor supply conduits and first and second liquid return conduits, wherein
the first vapor supply conduit and the first liquid return conduit are in fluid connection between the combined evaporator and receiver and the first condenser to establish a first two phase closed loop working fluid flow path between the cold bus and the first condenser; and wherein
the second vapor supply conduit and the second liquid return conduit are in fluid connection between the combined evaporator and receiver and the second condenser to establish a second two phase closed loop working fluid flow path between the combined evaporator and receiver and the second condenser.

4. The aircraft according to claim 3, wherein at least one of the first and second two phase closed loop working fluid flow paths includes a valve mechanism.

5. The aircraft according to claim 3, wherein each of the first and second two phase closed loop working fluid flow paths includes a valve mechanism.

6. The aircraft according to claim 1, wherein the first and second condensers are in fluid connection with one another in series.

7. The aircraft according to claim 6, further comprising:
a first collector positioned between the first and second condensers, the first collector for collecting a portion of the liquid phase working fluid condensed by the second condenser and having a vapor space thereabove containing a portion of the vapor phase working fluid;
at least one first vapor supply and liquid return conduit having one end in fluid connection with the combined evaporator and receiver and an opposite end terminating in the vapor space of the first collector;
at least one second vapor supply and liquid return conduit in fluid connection with the first collector and in heat-exchange relationship with the second condenser; and
a liquid return conduit in fluid connection with the first collector and the combined evaporator and receiver for returning the liquid phase working fluid from the first collector to the combined evaporator and receiver.

8. The aircraft according to claim 7, further comprising a valve mechanism positioned in the liquid return conduit.

9. The aircraft according to claim 6, further comprising:
a first collector positioned between the first and second condensers, the first collector for collecting a portion of the liquid phase working fluid condensed by the second condenser and having a vapor space thereabove containing a portion of the vapor phase working fluid;
a second collector positioned between the combined evaporator and receiver and the first condenser, the second collector for collecting another portion of the liquid phase working fluid condensed by the first condenser and having a vapor space thereabove containing another portion of the vapor phase working fluid;
at least one first vapor supply and liquid return conduit having one end in fluid connection with the combined evaporator and receiver and an opposite end terminating in the vapor space of the second collector;
at least one second vapor supply and liquid return conduit in heat-exchange relationship with the first condenser and having one end fluid-connected to the second collector and an opposite end terminating in the vapor space of the first collector; and
at least one third vapor supply and liquid return conduit in fluid connection with the first collector and in heat-exchange relationship with the second condenser;
a first liquid return conduit in fluid connection with the first collector and the combined evaporator and receiver for returning liquid phase working fluid from the first collector to the combined evaporator and receiver; and
a second liquid return conduit fluid connecting the second collector and the combined evaporator and receiver for returning liquid phase working fluid from the second collector to the combined evaporator and receiver.

10. The aircraft according to claim 9, wherein at least one of the first and second liquid return conduits includes a valve mechanism.

11. The aircraft according to claim 9, wherein each of the first and second liquid return conduits includes a valve mechanism.

12. A method for on-board cooling of multiple heat sources on board an aircraft having a fuselage defining a pressurized fuselage section and an unpressurized air supply stream, wherein the pressurized fuselage section is pressurized to establish a fuselage internal pressurized aircraft cabin providing a source of pressurized air internal to the aircraft fuselage, and wherein the unpressurized air supply stream is provided by a source of unpressurized air external to the aircraft fuselage and the aircraft cabin established therein when the pressurized fuselage section is pressurized, the method comprising:
(a) providing a combined evaporator and receiver which contains a liquid phase working fluid which changes state to a vapor phase working fluid in response to heat being transferred to the liquid phase working fluid from the multiple heat sources on board the aircraft;
(b) providing multiple heat transfer conduits extending between the multiple heat sources on board the aircraft and the combined evaporator and receiver, each of the heat transfer conduits being in a heat-exchange relationship with a respective one of the heat sources on board the aircraft and the combined evaporator and receiver by a portion of the conduits extending through the combined evaporator and receiver so that an external surface thereof is positioned below a liquid level of the liquid phase working fluid contained by the combined evaporator and receiver to thereby be surrounded by and immersed in the liquid phase working fluid in the combined evaporator and receiver;
(c) establishing a fluid connection between first and second condensers to the combined evaporator and receiver to allow the liquid and vapor phase working fluids to be directed to and received from the combined evaporator and receiver, respectively;
(d) operatively integrating the first condenser with the fuselage so as to be in a ductless heat-exchange relationship with the unpressurized air supply stream from the source of unpressurized air external to the aircraft fuselage,
(e) operatively positioning the second condenser within the pressurized fuselage section and bringing a pressurized air supply stream from the source of pressurized air internal to the aircraft cabin in heat-exchange relationship with the second condenser;
(f) condensing respective portions of the vapor phase working fluid by heat transfer between the first and second condensers and the unpressurized and pressurized air supply streams, respectively, to thereby form the liquid phase working fluid; and (g) returning the liquid phase working fluid condensed by the first and second condensers to the combined evaporator and receiver by virtue of the fluid connection with the first and second condensers.

13. The method according to claim 12, wherein step (c) further comprises establishing a fluid connection between the first and second condensers in parallel.

14. The method according to claim 13, wherein step (c) further comprises:
(c1) establishing a fluid connection between the combined evaporator and receiver and the first condenser with a first vapor supply conduit and a first liquid return conduit to establish a first two phase closed loop working fluid flow path between the combined evaporator and receiver and the first condenser; and
(c2) establishing a fluid connection between the combined evaporator and receiver and the second condenser with a second vapor supply conduit and a second liquid return conduit to establish a second two phase closed loop working fluid flow path between the combined evaporator and receiver and the second condenser.

15. The method according to claim 14, which further comprises controlling fluid flow in at least one of the first and second closed loop working fluid flow paths by a valve mechanism.

16. The method according to claim 12, wherein step (c) further comprises:
(c1) positioning a first collector between the first and second condensers for collecting a portion of the liquid phase working fluid condensed by the second condenser;
(c2) establishing a fluid connection between one end of at least one first vapor supply and liquid return conduit and the combined evaporator and receiver and terminating an opposite end thereof in a vapor space of the first collector;
(c3) establishing a fluid connection between at least one second vapor supply and liquid return conduit and the first collector in heat-exchange relationship with the second condenser; and
(c4) establishing a fluid connection with a liquid return conduit between the first collector and the combined evaporator and receiver for returning the liquid phase working fluid from the first collector to the combined evaporator and receiver.

17. The method according to claim 16, further comprising positioning a valve mechanism in the liquid return conduit.

18. (withdrawn and currently amended) The method according to claim 12, wherein step (c) further comprises:
(c1) positioning a first collector between the first and second condensers for collecting a portion of the liquid phase working fluid condensed by the second condenser;
(c2) positioning a second collector between the combined evaporator and receiver and the first condenser for collecting a portion of the liquid phase working fluid condensed by the first condenser;
(c3) establishing a fluid connection between one end of at least one first vapor supply and liquid return conduit and the combined evaporator and receiver and terminating an opposite end thereof in a vapor space of the second collector;
(c4) positioning at least one second vapor supply and liquid return conduit in heat-exchange relationship with the first condenser and establishing a fluid connection between one end thereof and the second collector and terminating an opposite end thereof in a vapor space of the first collector;
(c5) establishing a fluid connection between at least one third vapor supply and liquid return conduit and the first collector;
(c6) positioning the at least one third vapor supply and liquid return conduit in heat-exchange relationship with the second condenser and terminating an end thereof in a vapor space of the first collector;
(c7) establishing a fluid connection between the first collector and the combined evaporator and receiver by a first liquid return conduit for returning liquid phase working fluid from the first collector to the combined evaporator and receiver; and
(c8) establishing a fluid connection between the second collector and the combined evaporator and receiver with a second liquid return conduit for returning the liquid phase working fluid from the second collector to the combined evaporator and receiver.

19. The method according to claim 18, which comprises providing at least one of the first and second liquid return conduits with a valve mechanism.

20. The method according to claim 18, which comprises providing each of the first and second liquid return conduits with a valve mechanism.

* * * * *